US012665592B2

(12) United States Patent
    Vashishtha et al.

(10) Patent No.:     US 12,665,592 B2
(45) Date of Patent:        Jun. 23, 2026

(54) DEVICE AND METHOD FOR BULK INDUCED PRE-EMPHASIS TECHNIQUE IN CURRENT MODE TRANSMITTER FOR HIGH SPEED LINKS

(71) Applicant: STMicroelectronics International N.V., Geneva (CH)

(72) Inventors: Sameer Vashishtha, Greater Noida (IN); Saiyid Mohammad Irshad Rizvi, New Delhi (IN); Paras Garg, Noida (IN)

(73) Assignee: STMicroelectronics International N.V., Geneva (CH)

( * ) Notice:    Subject to any disclaimer, the term of this patent is extended or adjusted under 35 U.S.C. 154(b) by 175 days.

(21) Appl. No.: 18/481,907

(22) Filed:      Oct. 5, 2023

(65)            Prior Publication Data

US 2024/0128971 A1      Apr. 18, 2024

Related U.S. Application Data

(60) Provisional application No. 63/379,598, filed on Oct. 14, 2022.

(51) Int. Cl.
    H03K 17/56          (2006.01)
    H03K 5/01           (2006.01)
    *H03K 5/00*           (2006.01)

(52) U.S. Cl.
    CPC ...  H03K 17/56 (2013.01); *H03K 2005/00078* (2013.01); *H03K 5/01* (2013.01)

(58) Field of Classification Search
    CPC ..... H03K 17/693; H03K 17/56; H03K 17/122
    See application file for complete search history.

(56)            References Cited

U.S. PATENT DOCUMENTS

| | | | |
|---|---|---|---|
| 6,680,681 B1 | 1/2004 | Hsu et al. | |
| 7,196,557 B1 * | 3/2007 | Kwasniewski | ..... H04L 25/0286 |
| | | | 327/108 |
| 7,586,330 B2 * | 9/2009 | Kim | .................... H04L 25/0272 |
| | | | 326/82 |
| 8,275,030 B2 | 9/2012 | Werner et al. | |
| 9,219,470 B1 | 12/2015 | Venditti | |
| 2007/0057702 A1 * | 3/2007 | Suenaga | .......... H03K 19/09432 |
| | | | 327/108 |
| 2021/0152399 A1 * | 5/2021 | Hsieh | .................. H04L 25/0288 |
| 2022/0416767 A1 * | 12/2022 | Inoue | ...................... H10F 39/12 |

* cited by examiner

*Primary Examiner* — Patrick C Chen
(74) *Attorney, Agent, or Firm* — Seed Intellectual Property Law Group LLP

(57)            ABSTRACT

An integrated circuit includes a current mode transmitter having a first driver and a second driver. The first driver receives a single bit data stream. The second driver receives a delayed data stream corresponding to the single bit data stream delayed by a clock cycle. The current mode transmitter has a transition detector that generates a bulk modulation signal having a first value when the single bit data stream is the same as the delayed data stream and having a second value when the single bit data stream is different from the delayed data stream. The transition detector supplies the bulk modulation signal to the bulk terminals of driver switches of the first and second drivers.

17 Claims, 8 Drawing Sheets

*600*

RECEIVE A FIRST STREAM OF DATA VALUES AT A FIRST DRIVER OF A CURRENT MODE TRANSMITTER ⌐*602*

RECEIVE THE FIRST STREAM OF DATA VALUES AT A TRANSITION DETECTOR ⌐*604*

GENERATE, WITH THE TRANSITION DETECTOR, A BULK MODULATION VOLTAGE BASED ON THE FIRST STREAM OF DATA VALUES ⌐*606*

SUPPLY THE BULK MODULATION VOLTAGE TO A BULK TERMINAL OF A FIRST DRIVER SWITCH OF THE FIRST DRIVER ⌐*608*

DEVICE AND METHOD FOR BULK INDUCED PRE-EMPHASIS TECHNIQUE IN CURRENT MODE TRANSMITTER FOR HIGH SPEED LINKS

BACKGROUND

Technical Field

The present disclosure is related to integrated circuits, and more particularly, to integrated circuits that include current mode transmitters.

Description of the Related Art

Integrated circuits are utilized for a large variety of applications. In many applications, it is desirable to transmit data from one device to another. Integrated circuits can be utilized in various ways to transmit and receive data. Integrated circuits may transmit data to other integrated circuits on a same printed circuit board or in other configurations or systems.

One method of data transmission is current mode transmission. In current mode transmission, data is transmitted by modulating the current flowing in a transmission medium. This can be a highly effective way to transmit signals. However, one drawback to current mode transmission schemes is that it can be difficult to maintain low power consumption while ensuring high readability of signals.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

Embodiments of the present disclosure provide an integrated circuit that includes a current mode transmitter that is able to transmit data effectively and efficiently. The current mode transmitter includes a bulk modulation circuit that generates a bulk modulation signal for selectively biasing a bulk terminal of a driver switch. The value of the bulk modulation signal depends on whether or not a current data value is different from a most recent previous data value. By selectively biasing the bulk terminal of the driver switch in this manner, the current mode transmitter is able to efficiently and effectively transmit data.

In one embodiment, the current mode transmitter transmits data values by modulating transmission currents on two transmission lines. More particularly, data values are indicated by the voltage difference between the two data lines. An increase in the voltage difference amplitude indicates that the current data value is different from the previous data value. If the voltage difference decreases or stays the same, then the current data value is the same as the previous data value.

In one embodiment, the bulk modulation circuit generates the bulk modulation signal with a high value (e.g. VDD) when the current data value is different than the previous data value. Applying the high value of the bulk modulation signal to the bulk terminal of the driver switch reduces the threshold voltage of the driver switch, thereby enabling a higher current amplitude (and greater voltage difference) than if the threshold voltage was higher. The bulk modulation circuit generates the bulk modulation signal with a low value (e.g. ground) when the current data value is the same as the most recent value. Thus, when the voltage difference is to increase, the bulk terminal of the driver switch receives a high voltage. When the voltage difference is to decrease or stay the same, the bulk terminal of the driver switch receives a low voltage. This results in improved efficiency in current mode data transmission.

In one embodiment, the driver switch includes a plurality of transistors coupled in parallel. The driver switch may receive the bulk modulation signal on the bulk terminals of each of the plurality of transistors. In one embodiment, the driver switch receives the bulk modulation signal on the bulk terminals of only some of the transistors, while the other transistors always received ground under bulk terminals.

In one embodiment, an integrated circuit includes an input data source and a current mode transmitter coupled to the input data source. The current mode transmitter includes a primary driver including a first driver switch, a secondary driver including a second driver switch, a delay circuit coupled between the input data source and the secondary driver, and a transition detector. The transition detector includes a first input coupled to the input of the primary driver and the secondary driver, a second input coupled to the input of the secondary driver, and an output coupled to a bulk terminal of the first driver switch and to a bulk terminal of the second driver switch.

In one embodiment, an integrated circuit includes a first driver of a current mode transmitter. The first driver includes an input and a first driver switch having a bulk terminal. The integrated circuit includes a transition detector having an input coupled to an input of the first driver circuit and an output coupled to the bulk terminal of the first driver switch.

In one embodiment, a method includes receiving a first stream of data values at a first driver of a current mode transmitter and receiving the first stream of data values at a transition detector. The method includes generating, with the transition detector, a bulk modulation voltage based on the first stream of data values and supplying the bulk modulation voltage to a bulk terminal of a first driver switch of the first driver.

In one embodiment, a method includes receiving a first stream of data values at a first driver of a current mode transmitter, generating a second stream of data values by delaying the first stream of data values by one or more cycles of a clock signal, receiving the second stream of data values at a second driver of the current mode transmitter, and receiving the first and second streams of data values at a transition detector. The method includes generating, with the transition detector, a bulk modulation voltage having an amplitude based on the first and second data streams, supplying the bulk modulation voltage to a bulk terminal of a first driver switch of the first driver, supplying the bulk modulation voltage to a bulk terminal of a second driver switch of the second driver, and generating a current mode data stream based on outputs of the first and second drivers.

BRIEF DESCRIPTION OF THE SEVERAL VIEWS OF THE DRAWINGS

Reference will now be made by way of example only to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1A:
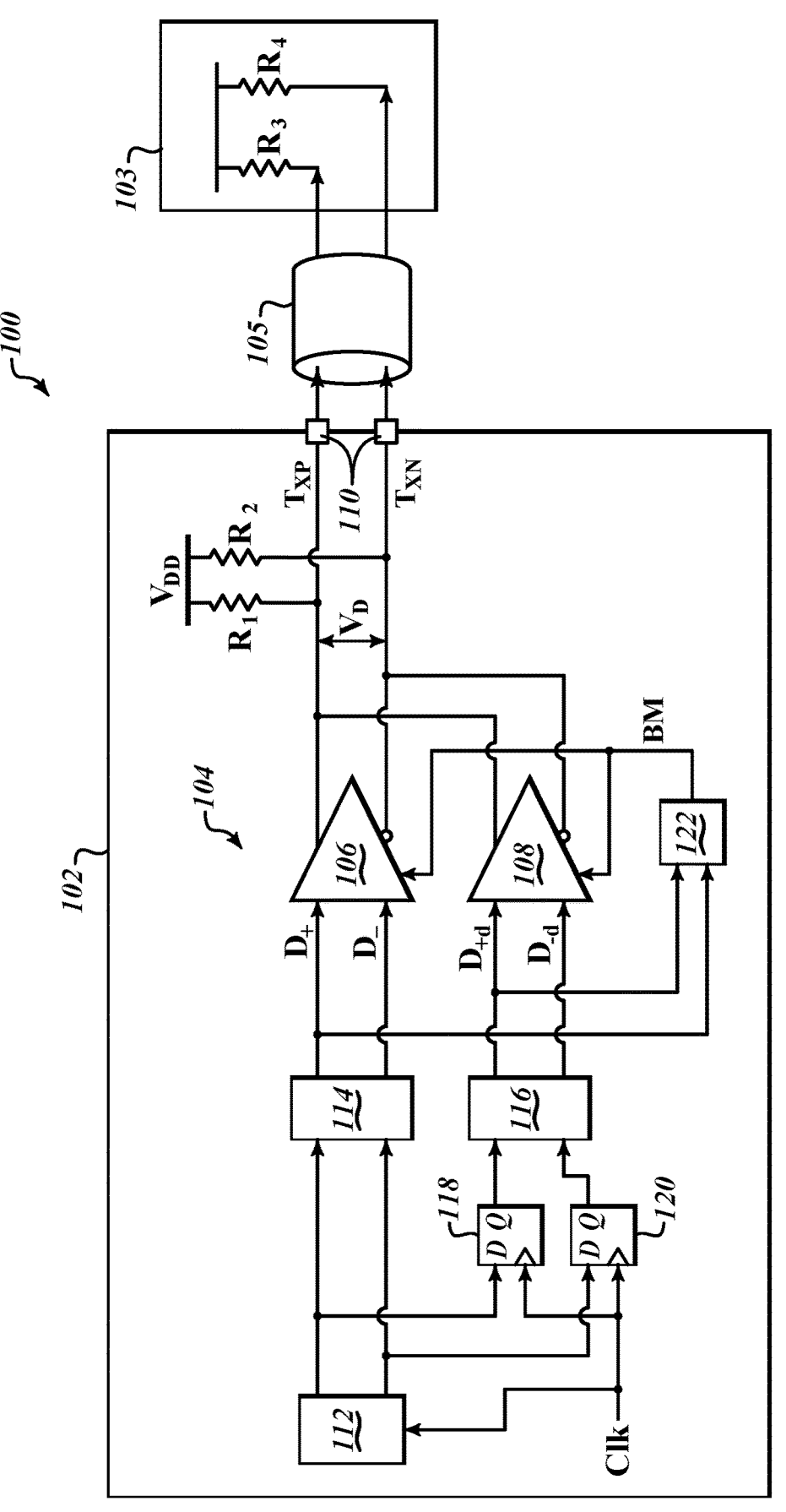
FIG. 1A is a schematic diagram of a system including a current mode transmitter, according to one embodiment.

FIG. 1A is a schematic diagram of a system 100, according to one embodiment. The system 100 includes a first integrated circuit 102 and a second integrated circuit 103. The first and second integrated circuits 102 and 103 are coupled together in a current mode transmission scheme. As will be set forth in more detail below, the components of the integrated circuit 102 cooperate to provide a bulk modulation signal that increases the efficiency and readability of the current mode transmitter 104.

The integrated circuits 102 and 103 are coupled together by a transmission medium 105. The transmission medium 105 can include structures, circuits, or components that enable the transmission of current mode data signals between the integrated circuit 102 and the integrated circuit 103.

In one embodiment, the system 100 is implemented on a printed circuit board. In this case, the integrated circuits 102 and 103 are coupled to the printed circuit board. The transmission medium 105 can include conductive signal traces that communicatively couple the first integrated circuit 102 to the second integrated circuit 103. The signal traces can include metal lines or other conductive structures. The transmission medium 105 can include other types of signal propagation structures without departing from the scope of the present disclosure.

The integrated circuit 102 includes a current mode transmitter 104. The current mode transmitter 104 includes a first driver 106 and a second driver 108. The first driver 106 may be termed a primary driver or a main driver. The second driver 108 may be termed a secondary driver or a delay driver.

The driver 106 includes a first output terminal coupled to a transmission line TXP. The driver 106 includes a second output terminal coupled to a second transmission line TXN. The driver 108 includes a first output terminal coupled to the transmission line TXP. The driver 108 includes a second output terminal coupled to the transmission line TXN. The transmission lines TXP and TXN are each coupled to a respective terminal 110 of the integrated circuit 102. As will be set forth in more detail below, the drivers 106 and 108 drive currents through the transmission lines TXP and TXN. The data values may be read by the integrated circuit 103 as voltage differences between TXP and TXN based on the drive currents.

The integrated circuit 102 includes a data generator 112. The data generator 112 generates a stream of data values. In particular, the data generator 112 generates a single bit stream of data values. The data generator 112 outputs the single bit stream of data values in accordance with a clock signal CLK. In one embodiment, the data generator 112 outputs a single-bit data value on each cycle of the clock signal CLK. The data generator 112 can represent any circuit, or combination of circuits within the integrated circuit 102 that may generate data values for current mode data transmission.

In one embodiment, the data generator 112 is a parallel in serial out (PISO) circuit. In this case, the data generator 112 may receive a plurality of data values in parallel in accordance with a second clock signal having a frequency lower than the first clock signal. The PISO serializes the plurality of data values into a single bit serial data stream. Because the first clock cycle CLK that controls the PISO has a frequency that is much faster than the frequency of the second clock signal, the PISO 112 is able to serialize the parallel data values into a single bit serial data stream. Other types of data generators 112 can be utilized without departing from the scope of the present disclosure.

The data generator 112 includes two data outputs. In practice, the two data outputs collectively provide the single bit data stream. The first data output of the data generator 112 may output the single bit data stream, while the second data output may output the logical complement of the single bit data stream. Accordingly, if the first data output has a logical high value, then the second data output has a logical low value. If the first data output has a logical low value, then the second data output has a logical high value.

In one embodiment, the data generator 112 outputs the single bit data stream in a voltage modulation scheme. In a voltage modulation scheme, a high voltage may represent a logical 1 while a low voltage may represent a logical 0, or vice versa. Other transmission schemes can be utilized for the data generator 112 without departing from the scope of the present disclosure.

In one embodiment, the clock signal CLK is a high-speed clock signal. The clock signal CLK may have a frequency between 100 MHz and 20 GHz. Other frequencies can be utilized for the clock signal CLK without departing from the scope of the present disclosure.

The current mode transmitter 104 includes a first pre-driver circuit 114. The first predriver circuit receives the first and second data outputs from the data source 112. In other words, the first predriver circuit 114 receives the single bit data stream from the data source 112. It is possible that the data source 112 may output the serial data signal with a nonstandard voltage modulation. For example, the amplitude differences between high and low values in the data stream may be lower or higher than desired. The predriver circuit 114 may perform the function of receiving the data stream from the data source 112 in nonstandard amplitudes and outputting the data stream with desired amplitudes. For example, the predriver circuit 114 may ensure that logical high values of the data stream have an amplitude of VDD, while logical low values of the data stream have an amplitude of ground or 0 V.

The first predriver circuit 114 has a first output terminal that provides data values $D_+$. The first predriver circuit 114 is a second output terminal that provides data values $D_-$. In practice, $D_-$ may simply be the logical complement of $D_+$. As described previously the data source 112 provides first and second data output, with the second output being the logical complement of the first output. Similarly, the first predriver circuit 114 applies first and second data outputs, with $D_-$ being the logical complement of $D_+$.

In one embodiment, the predriver circuit 114 includes a first plurality of buffer circuits coupled in series. The first plurality of buffer circuits receives the first output of the data source 112 and outputs the serial data stream $D_+$. The predriver circuit 114 also includes a second plurality of buffer circuits coupled in series. The second plurality of buffer circuits receives the second output of the data source 112 and outputs the serial data stream $D_-$. The first and second plurality of buffer circuits have the same number of buffer circuits. The predriver circuit 114 can have other components and configurations of components without departing from the scope of the present disclosure.

The first driver circuit 106 has a first input terminal that receives the data values $D_+$ from the predriver circuit 114. The first driver circuit 106 has a second input terminal that receives the data values $D_-$ from the predriver circuit 114. The first driver circuit 106 contributes data transmission currents onto the transmission lines TXP and TXN based on $D_+$ and $D_-$. Further details regarding the function of the first driver 106 will be provided below.

The current mode transmitter 104 includes a first flip-flop 118 and a second flip-flop 120. The first and second flip-flops 118 and 120 receive the clock signal CLK on the respective clock input terminals. The data terminal of the first flip-flop 118 is coupled to the first output of the data source 112. The data terminal of the second flip-flop 120 is coupled to the second output of the data source 112. The data output terminal of the first flip-flop 118 is coupled to a first input of the second predriver 116. The data output terminal of the second flip-flop 120 is coupled to a second input of the second predriver 116.

When the data source 112 outputs a new data value in accordance with a current cycle of the clock signal CLK, the data value is received substantially immediately by the first predriver 114. However, the second predriver 116 does not receive the new data value substantially immediately. Instead, the second predriver 116 receives the data value with a delay relative to the first predriver circuit 116. The delay of the second predriver 116 relative to the first predriver 114 is the period of a single cycle of the clock signal CLK. This is because when the flip-flops 118 and 120 receive the new data value (the new data value and the logical compliment, respectively) the flip-flops 118 and 120 do not output the new data value until the next rising edge (or falling edge, according to the configurations of the flip-flops 118 and 120) of the clock signal CLK. The result is that the second predriver 116 is always one clock signal behind the first predriver 114.

As an example, if the data source 112 outputs a series of N data values on N consecutive cycles of the clock signal CLK, the then the first predriver circuit 114 receives the first data value on the first clock cycle. The predriver circuit 116 does not receive a data value on the first clock cycle. The predriver circuit 114 receives the second data value on the second clock cycle. The predriver circuit 116 receives the first data value on the second clock cycle. The first predriver circuit 114 receives the third data value on the third clock cycle. The second predriver circuit 116 receives the second data value on the third clock cycle. This continues until the first predriver 114 receives the Nth data value on the Nth clock cycle and the second predriver 114 receives the Nth data value on clock cycle N+1. Accordingly, the inputs of the second predriver circuit 116 are delayed by a single clock cycle relative to the first predriver circuit 114.

The second predriver circuit 116 can perform substantially the same function as the first predriver circuit 114. In particular, the second predriver circuit 116 receives delay data values with possibly nonstandard amplitudes and outputs delayed data values $D_{+d}$ and $D_{-d}$. The delayed data value $D_{+d}$ corresponds to $D_+$, but delayed by a single clock cycle. The delayed data value $D_{-d}$ corresponds to $D_-$, but delayed by a single clock cycle. The second predriver circuit 116 can have substantially the same structures or components as the first predriver circuit 114. For example, the second pre-are circuit 116 can include first and second groups of serially coupled buffers, having the same numbers of buffers as the first and second groups of serially coupled buffers in the first predriver circuit 114.

The second driver circuit 108 has a first input terminal that receives the delayed data values $D_{+d}$ from the predriver circuit 116. The second driver circuit 108 has a second input terminal that receives the data values $D_{-d}$ from the predriver circuit 116. The second driver circuit 108 contributes data transmission currents onto the transmission lines TXP and TXN based on $D_{+d}$ and $D_{-d}$.

The first output of the second driver 108 is coupled to the transmission lines TXP. The second output of the second driver 108 is coupled to the transmission line TXN. Accordingly, the first output of the second driver 108 contributes current to the transmission line TXP. The second output of the second driver 108 contributes current to the transmission line TXN. Accordingly, the total current flowing in the transmission lines is based on the current supplied by both the first driver 106 and the second driver 108.

The current mode transmitter 104 also includes resistors R1 and R2. The resistor R1 is coupled between TXP and VDD. The resistor R2 is coupled between TXN and the VDD. The resistors R1 and R2 have a same value. In one embodiment, the resistors R1 and R2 each have a value of 50 ohms. The resistors R1 and R2 can have other values without departing from the scope of the present disclosure.

The second integrated circuit 103 includes resistors R3 and R4. The resistor R3 is coupled between VDD and TXP. The resistor R4 is coupled between VDD and TXN. In one embodiment, the resistors R3 and R4 have the same values as resistors R1 and R2. Accordingly, the resistors R1 and R2 and R3 and R4 are utilized for impedance matching between the integrated circuits 102 and 103.

Figure 1B:
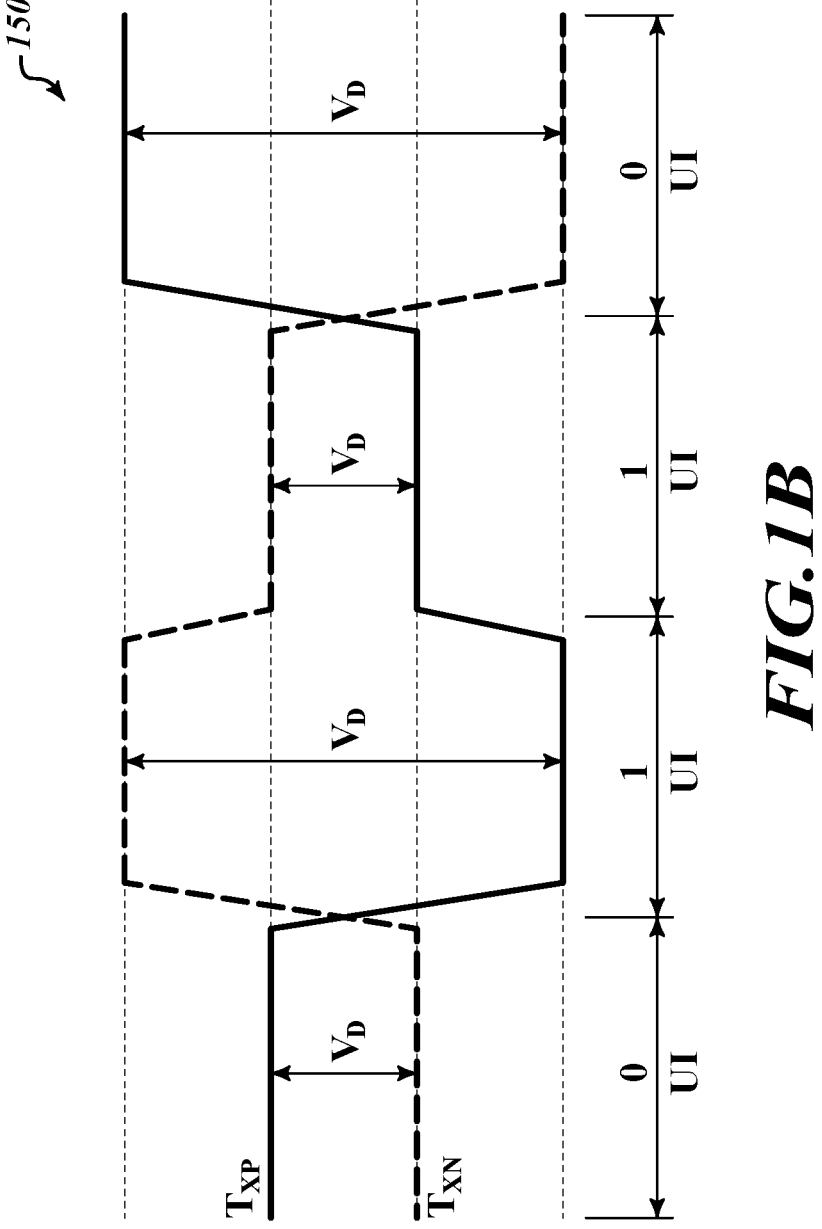
FIG. 1B is a graph illustrating voltage difference between transmission lines of the current mode transmitter of FIG. 1A, in accordance with some embodiments.

Prior to describing further details regarding the components of the current mode transmitter 104, it is beneficial to describe current mode transmission signals in reference to FIG. 1B. FIG. 1B is a graph 150 illustrating voltages on the transmission lines TXP and TXN. The voltage Vp is the voltage on the transmission line TXP. The voltage Vn is the voltage on the transmission line VXN. The voltages are based on how the drivers 106 and 108 drive currents through the resistors R1-R4. Accordingly, Vp can be given by the following relationship:

$$Vp = VDD - Rp * Ixp,$$

where Ixp is the sum of the currents flowing through R1 and R3 into the drivers 106 and 108, and Rp is the parallel resistance of R1 and R3 (or the parallel resistance between R2 and R4). Ixp can have values of I1, I2, I1+I2, or 0, where I1 is the current driven by the driver 106 and I2 is the current driven by the driver 108. Vn can be given by the following relationship:

$$Vn = VDD - Rp * Ixn,$$

where Ixn is the sum of the currents flowing through R2 and R4 into the drivers 106 and 108. In can have values of I1, I2, I1+I2, or 0.

FIG. 1B illustrates a differential voltage VD corresponding to the amplitude of the voltage difference between TXP and TXN. Accordingly, VD is the amplitude of Vp-Vn. VD can have a low value of VD=Rp*(I1-I2). VD can have a high value of Rp*(I1+I2). As set forth in more detail below, both I1 and I2 have higher values in the high amplitude mode than in the low amplitude mode.

FIG. 1B illustrates a plurality of unit intervals UI. Each unit interval (UI) corresponds to the period of one cycle of the clock CLK. A data value of either 0 or 1 is assigned to each UI. The data value assigned to the UI corresponds to the data value of the single bit serial data stream for that UI.

The data values are encoded as changes in the amplitude of VD, or as changes in the amplitude of the currents flowing in the transmission line. VD can have one of two values: a high value and a low value. If VD has a high value during a UI, then the data value during that UI is different from the data value during the preceding UI. If VD has the low value during a UI, then the data value during that UI is the same as during the previous UI.

With reference to FIG. 1B, during the first UI, the single bit data stream has a data value of 0 and VD has a low value. During the second UI, the single bit data stream has a data value 1. This represents a change from the data value of the first UI. Accordingly, the amplitude of VD increases to the high value during the second UI. During the third UI, the data value of the single bit data stream is 1. Accordingly, the amplitude of VD decreases from the high value to the low value in the third UI, indicating that the data value in the third UI is the same as the data value in the second UI. The data value for the fourth UI is 0. This represents a change from the data value of the third UI. Accordingly, the amplitude of VD increases to the high value during the fourth UI. Accordingly, data is encoded in TXP and TXN based on whether or not the amplitude changes.

With reference again to FIG. 1A, as described previously the first and second drivers 106 and 108 each have a respective driver switch. Each driver switch has a bulk terminal. This is shown in greater detail in relation to FIG. 2. The threshold voltage of the driver switches is based, in part, on the voltage of the bulk terminals. For N type driver switches, a higher voltage on the bulk terminal results in a lower threshold voltage. A lower threshold voltage in turn results in higher currents for a given gate to source voltage. When it is desired to have a high value VD, it is beneficial to drive a higher current through the driver switches. Accordingly, the current mode transmitter 103 modulates the voltage of the bulk terminals of the driver switches of the drivers 106 and 108. The modulation includes applying a high voltage, such as VDD, to the bulk terminals of the driver switches when a high value of VD is desired. The modulation includes applying a low voltage, such as ground, to the bulk terminals of the driver switches when a low value of VD is desired. This can result in greater differences in VD between high and low amplitudes, resulting in more reliable reading of data at the integrated circuit 103.

The current mode transmitter 104 includes a transition detector 122. The transition detector 122 generates a modulation voltage BM. The modulation voltage BM is supplied to the bulk terminals of the driver switches of the drivers 106 and 108. The modulation voltage BM has a high value when $D_+$ and $D_{+d}$ have different values. Because $D_{+d}$ is delayed from $D_+$ by a single clock cycle, or UI, different values of $D_+$ and $D_{+d}$ indicates changes in the value of the data stream between a most recent UI and the current UI. The transition detector may also be termed a bulk voltage modulation generator.

The transition detector 122 includes a first input coupled to the first output of the predriver 114 and the first input of the driver 106. The transition detector 122 includes a second input coupled to the first output of the predriver 116 and the first input of the driver 108. The transition detector 122 includes an output coupled to bulk terminals of the driver switches of the drivers 106 and 108.

In one embodiment, the transition detector 122 detects transitions in the data values from one UI to the next, or from one clock cycle to the next. If there is a transition, i.e. if a current UI is different from the data value of the previous UI, then BM goes high. If the data value of the current UI is the same as the data value of the previous UI, then BM is low.

In one embodiment, the transition detector 122 is an XOR gate. The XOR gate has a first input coupled to the first output of the predriver 114. The XOR gate has a second input coupled to the first output of the predriver 116. The XOR gate has an output coupled to the bulk terminals of the driver switches of the driver circuits 106 and 108. Other types of detection logic circuits or logic gates can be utilized for the transition detector 122 without departing from the scope of the present disclosure.

Figure 2:
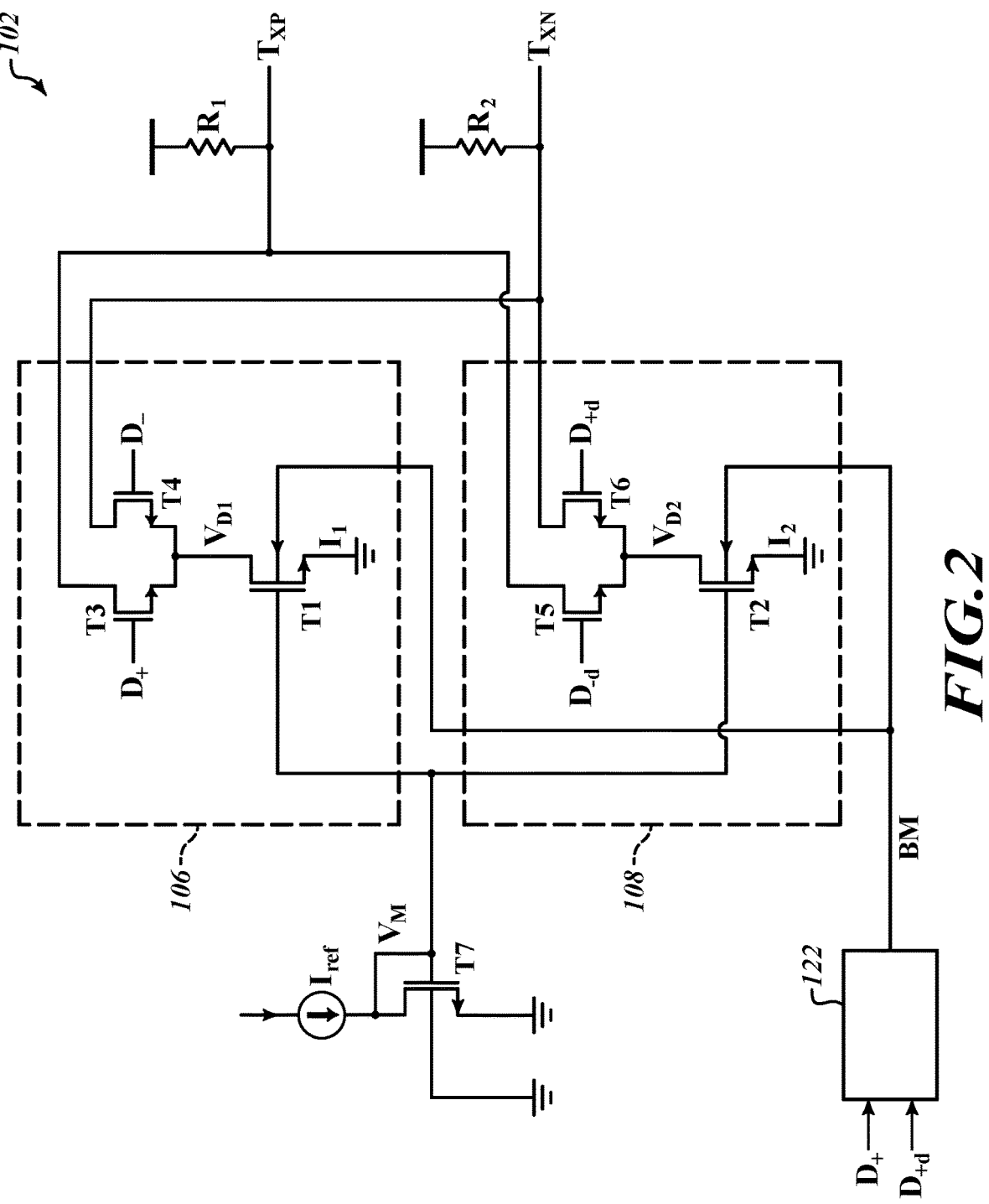
FIG. 2 is a schematic diagram of a driver circuit of a current mode transmitter, according to one embodiment.

FIG. 2 is a schematic diagram of portions of the integrated circuit 102, according to one embodiment. FIG. 2 illustrates the first driver 106 and the second driver 108 of the current mode transmitter 104, as well as the transition detector 122, of FIG. 1, according to one embodiment.

The driver 106 includes a driver switch T1, an NMOS transistor T3, and an NMOS transistor T4. The NMOS driver switch T1 is an NMOS transistor. The source terminals of the transistors T3 and T4 are coupled to the driver switch of the transistor T1. The gate terminal of the transistor T3 receives the data value $D_+$. The gate terminal of the transistor P4 receives the data value $D_-$. The drain terminal of the transistor T3 is coupled to the transmission line TXP. The drain terminal of the transistor T4 is coupled to the transmission line TXN. The source terminal of the driver switch T1 is coupled to ground. The gate terminal of the driver switch T1 is coupled to the gate terminal of a current mirror transistor T7, as will be described in more detail below. The bulk terminal of the driver switch T1 is coupled to the output of the transition detector 122 and receives the bulk modulation voltage BM.

The driver 108 includes a driver switch T2, an NMOS transistor T5, and an NMOS transistor T6. The NMOS driver switch T2 is an NMOS transistor. The source terminals of the transistors T5 and T6 are coupled to the drain terminal of the driver switch T2. The gate terminal of the transistor T5 receives the data value $D_{-d}$. The gate terminal of the transistor T6 receives the data value $D_{+d}$. The drain terminal of the transistor T5 is coupled to the transmission line TXP. The drain terminal of the transistor T6 is coupled to the transmission line TXN. The source terminal of the driver switch T2 is coupled to ground. The gate terminal of the driver switch T2 is coupled to the gate terminal of a current mirror transistor T7, as will be described in more detail below. The bulk terminal of the driver switch T2 is coupled to the output of the transition detector 122 and receives the bulk modulation voltage BM.

The NMOS transistor T7 is coupled to the gate terminals of the drive switches T1 and T2 in a current mirror configuration. The drain terminal of the transistor T7 is coupled to the output of a current source that provides a reference current Iref. The drain terminal of the transistor T7 is coupled to the gate terminal of the transistor T7. The bulk terminal of the transistor T7 is coupled to ground. The source terminal of the transistor T7 is coupled to ground.

The current mirror configuration of the transistor T7 causes the driver switch T1 to drive a current I1. The current I1 may be different from the current Iref based on the relative sizes of T1 and T7. If T1 is larger, i.e., has a higher effective width to length ratio than T7, then I1 will be larger than Iref. Furthermore, as described previously, I1 has a variable value based on the value of the bulk modulation signal BM. I1 is higher when BM is high than when BM is low. Accordingly, I1 has a high value when BM is high. I1 has a low value when BM is low.

The current mirror configuration of the transistor T7 causes the driver switch T2 to drive a current I2. The current I2 may be different from the current Iref based on the relative sizes of T2 and T7. If T2 is larger, i.e., has a higher effective width to length ratio than T7, then I2 will be larger than Iref. Furthermore, as described previously, I2 has a variable value based on the value of the bulk modulation signal BM. I2 is higher when BM is high than when BM is low. Accordingly, I2 has a high value when BM is high. I2 has a low value when BM is low.

The driver switches T1 and T2 may be designed so that I1 has a higher magnitude than I2. Alternatively, the driver switches T1 and T2 may be designed so that I2 has a higher magnitude than I1.

The operation of the driver circuits 106 and 108 the can be understood in relation to FIGS. 2 and 1B. The current I1 will either flow through T3 or T4 into T1, depending on the values of $D_+$ and $D_-$. If I1 flows through T3, then I1 flows from R1 and R3 through TXP into the driver 106. If I1 flows through T4, then I1 flows from R2 and R4 through TXN into the driver 106. The current I2 will either flow through T5 or T6 into T2, depending on the values of $D_{+d}$ and $D_{-d}$. If I2 flows through T5, then I2 flows from R1 and R3 through TXP into the driver 108. If I2 flows through T6, then I2 flows from R2 and R4 through TXN into the driver 108.

With reference to both FIGS. 2 and 1B, during the first UI the data value is 0. Though not shown, the data value during the UI before the first UI shown in FIG. 1B was also 0. Thus, during the first UI, $D_+$ and $D_{+d}$ are both 0, while $D_-$ and $D_{-d}$ are both 1. The result is that I1 flows through the resistors R2 and R4 (not shown) into the transmission line TXN, through the transistor T4 and through the driver switch T1. This results in a voltage on TXN of Vn=VDD−Rp*I1. The current I2 flows through the resistors R1 and R3 (not shown), through the transistor T5 and through the driver switch T2. This result is a voltage on TXP of Vp=VDD−Rp*I2. The result is that VD=Rp*(I1−I2), where I1 and I2 have their low values due to the low value of BM.

During the second UI, the data value is 1. The data value during the first U1 was 0. Thus, during the second UI, $D_+$ and $D_{-d}$ are both 1, while $D_-$ and $D_{+d}$ are both 0. The result is that I1 and I2 both flow through the resistors R1 and R3, while no current flows through R2 and R4. This results in Vp=VDD−Rp*(I1+I2), Vn=VDD, and VD=Rp*(I1+I2), where I1 and I2 have their higher values due to the high value of BM.

During the third UI, the data value is 1. The data value during the second U1 was 1. Thus, during the third UI, $D_+$ and $D_{+d}$ are both 1, while $D_-$ and $D_{-d}$ are both 0. The result is that I1 flows through the resistors R1 and R3, while I2 flows through the resistors R2 and R4. This results in Vp=VDD−Rp*I1, Vn=VDD−Rp*I2, and VD=Rp*(I1−I2), where I1 and I2 have their lower values due to the low value of BM.

During the fourth UI, the data value is 0. The data value during the third U1 was 1. Thus, during the fourth UI, $D_+$ and $D_{-d}$ are both 0, while $D_-$ and $D_{+d}$ are both 1. The result is that I1 and I2 flow through the resistors R2 and R4, while no current flows through the resistors R1 and R3. This results in Vp=VDD), Vn=VDD−Rp*(I1+R2), and VD=Rp*(I1+I2), where I1 and I2 have their higher values due to the high value of BM.

Figure 3:
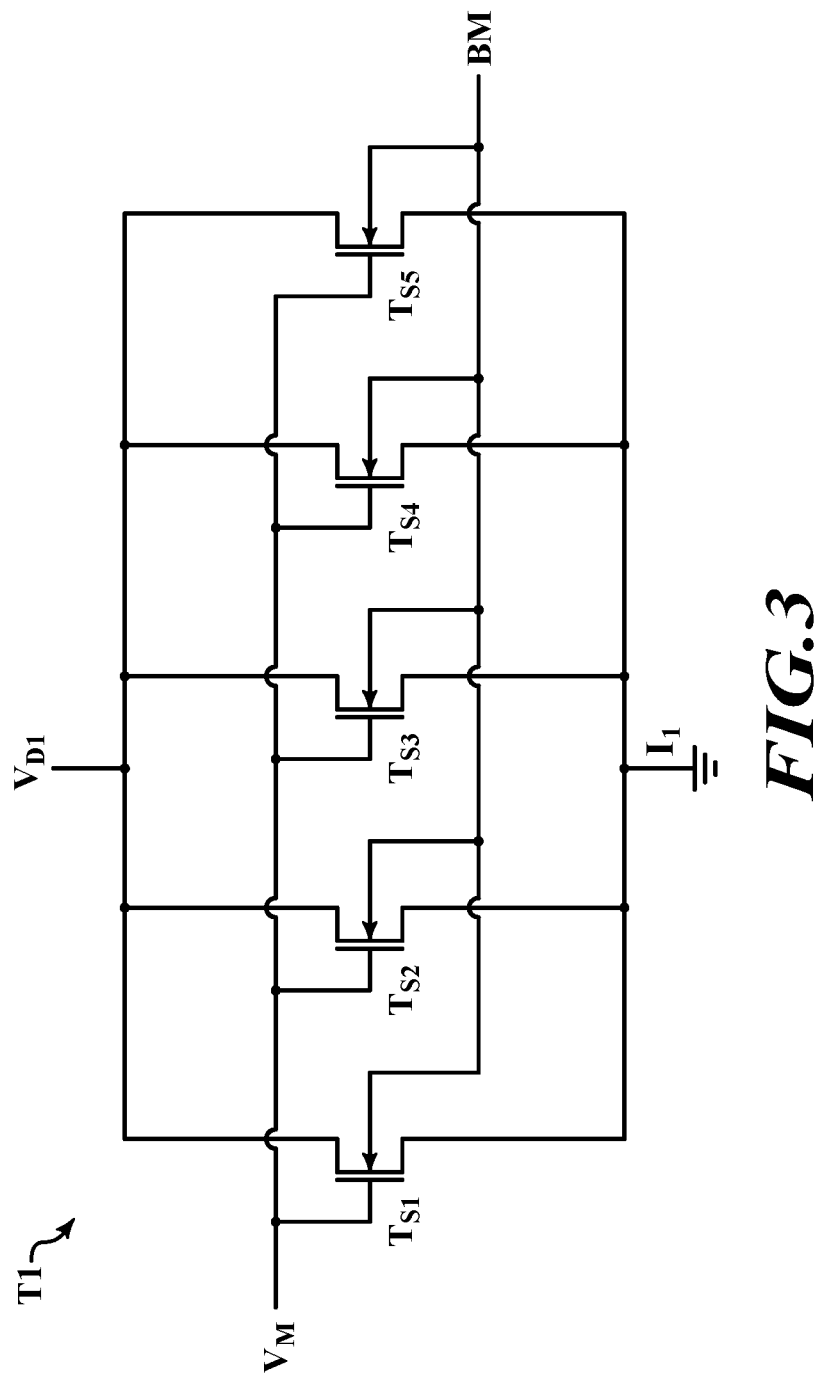
FIG. 3 is a schematic diagram of a driver switch of a current mode transmitter, according to one embodiment.

FIG. 3 is a schematic diagram of a driver switch T1, in accordance with some embodiments. The driver switch T1 includes a plurality of transistors TS1-TS5 coupled together in parallel. The drain terminals of the transistors TS1-TS5 are all coupled together. The source terminals of the transistors TS1-TS5 are all coupled together. The gate terminals of the transistors TS1-TS5 all receive the mirror voltage VM. The bulk terminals of the transistors TS1-TS5 all receive the bulk modulation signal BM. The current I1 is the sum of the currents flowing through all of the transistors TS1-TS5. While FIG. 3 illustrates a driver switch T1 including five transistors, the driver switch T1 can have other numbers of transistors coupled in parallel without departing from the scope of the present disclosure. The driver switch T2 can be substantially identical to the driver switch T1. In some embodiments, the driver switch T2 has a smaller number of parallel-coupled transistors than does the driver switch T1.

Figure 4:
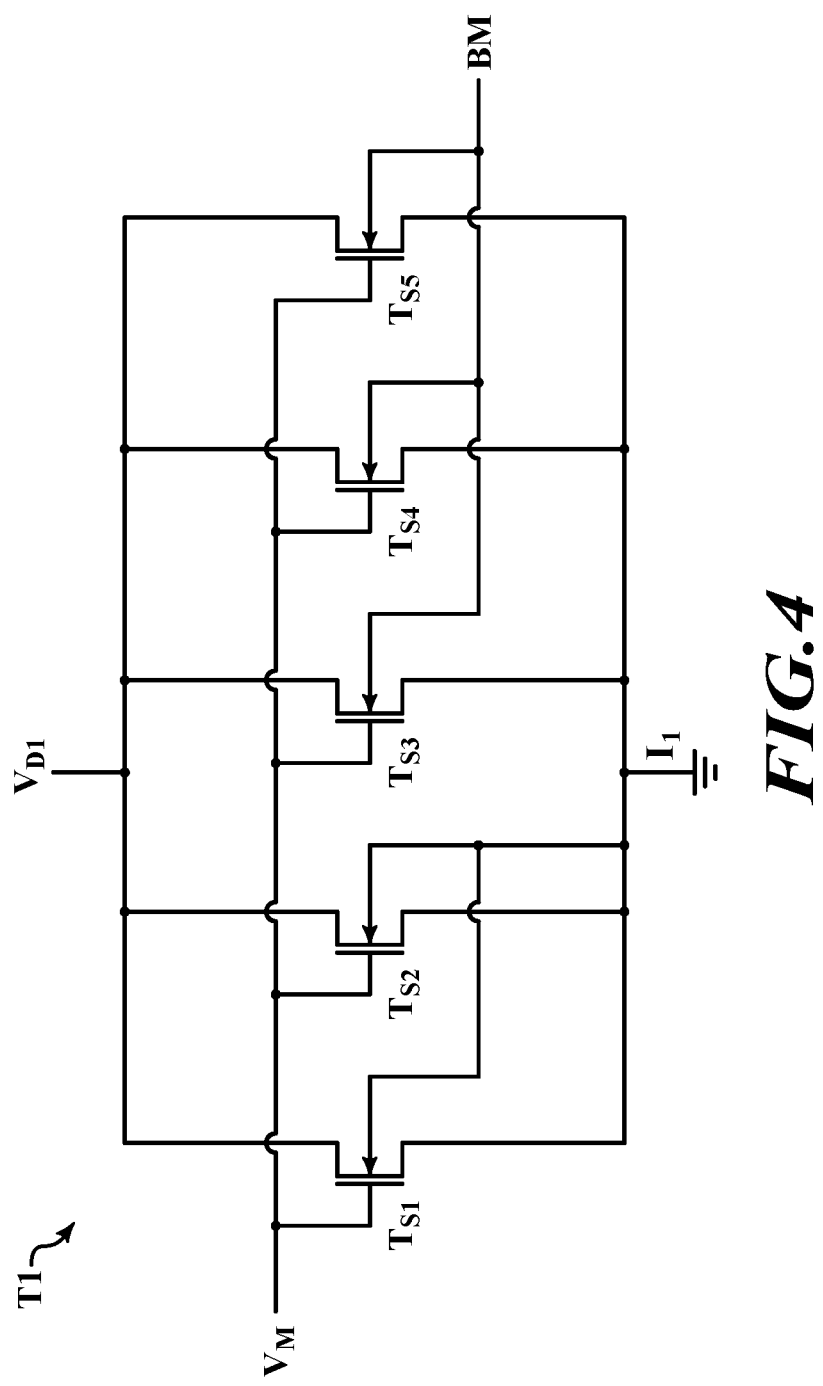
FIG. 4 is a schematic diagram of a driver switch of a current mode transmitter, according to one embodiment.

FIG. 4 is a schematic diagram of a driver switch T1, in accordance with some embodiments. The driver switch T1 of FIG. 4 is substantially identical to the driver switch T1 of FIG. 3, except that only a subset of the transistors receives the bulk modulation voltage, while the other transistors of the bulk terminal coupled to ground. In particular, the bulk terminals of TS1 and TS2 are coupled to ground, while the bulk terminals of the transistors TS3-TS5 receive the bulk modulation signal BM. The driver switch T2 can be substantially identical to the driver switch T1. In some embodiments, the driver switch T2 has a smaller number of parallel-coupled transistors than does the driver switch T1. The driver switch T2 may have a same number of transistors that receive the bulk modulation signal BM as the driver switch T1. Alternatively, the driver switch T2 may have a different number of transistors that receive the bulk modulation signal BM.

Figure 5:
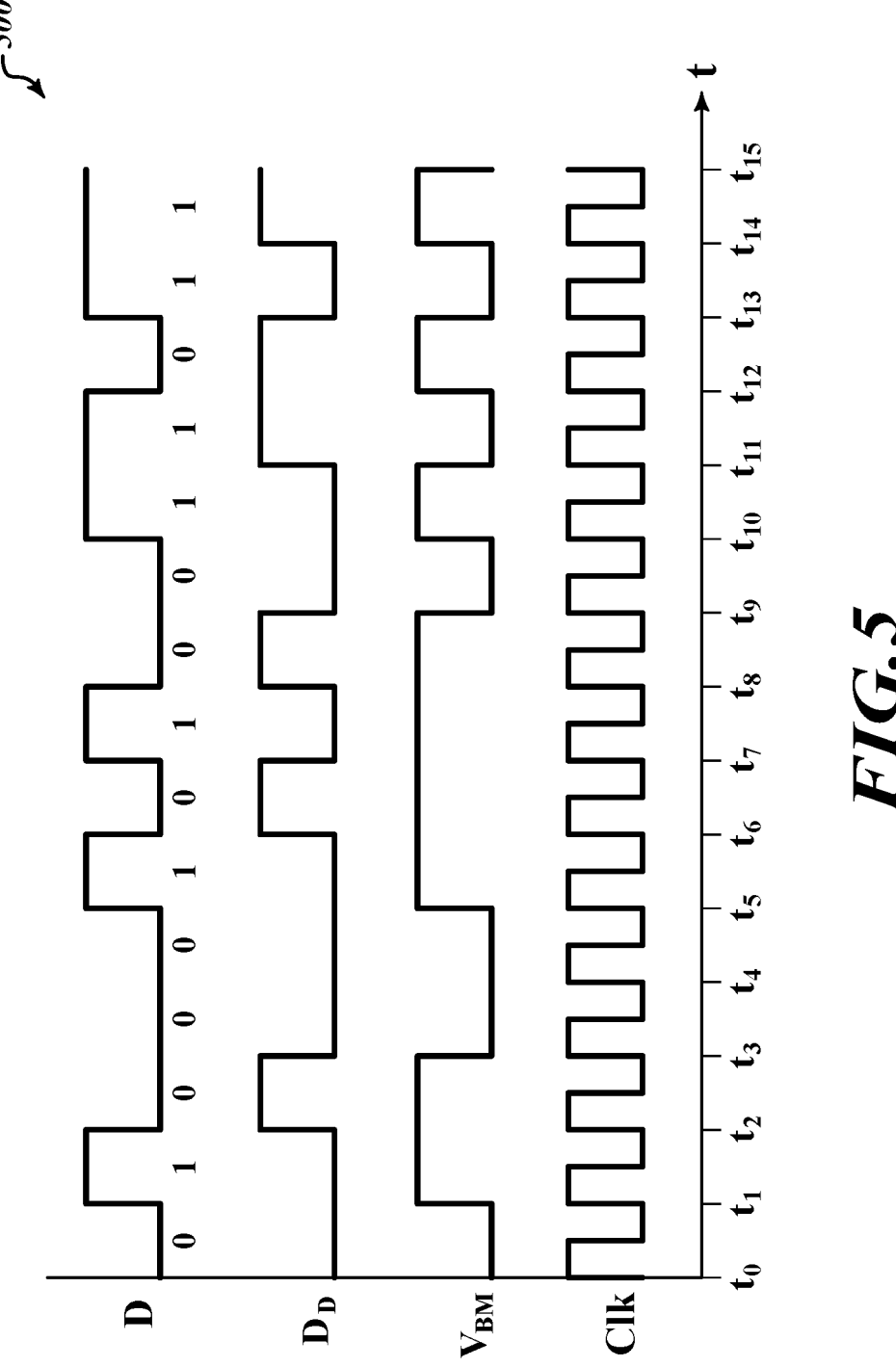
FIG. 5 is a graph of various signals associated with current mode data transmission, according to one embodiment.

FIG. 5 is a graph 500 including a plurality of signals related to current mode transmission, according to one embodiment. FIG. 5 illustrates the clock signal CLK and times t0-t15. UI1 corresponds to the first clock cycle having a period between times t0 and t1. UI2 corresponds to the second clock cycle having a period between times t1 and t2. This pattern continues until UI15 corresponding to the $15^{th}$ clock cycle between t14 and t15. The graph 500 illustrates the single bit data stream D. The single bit data stream has a data value of either binary 0 or binary 1 for each UI, or for each clock cycle. The graph 500 illustrates the delayed single bit data stream $D_D$, delayed from the single bit data stream D by a single clock cycle or by a single UI.

The graph 500 also illustrates the bulk modulation voltage VBM. The bulk modulation voltage of VBM has a value that is high when D and $D_D$ have different values. VBM has a low value when D and $D_D$ have the same value. For example, at UI1, D and $D_D$ are both 0, so VBM is low. At UI2, D is 1 and DD is 0, so VBM is high. At UI3, D is 0, $D_D$ is 1, and VBM is 1. At UI4, D and $D_D$ are both 0, so VBM is low. This pattern is evident through the remainder of the UIs or clock cycles.

Figure 6:
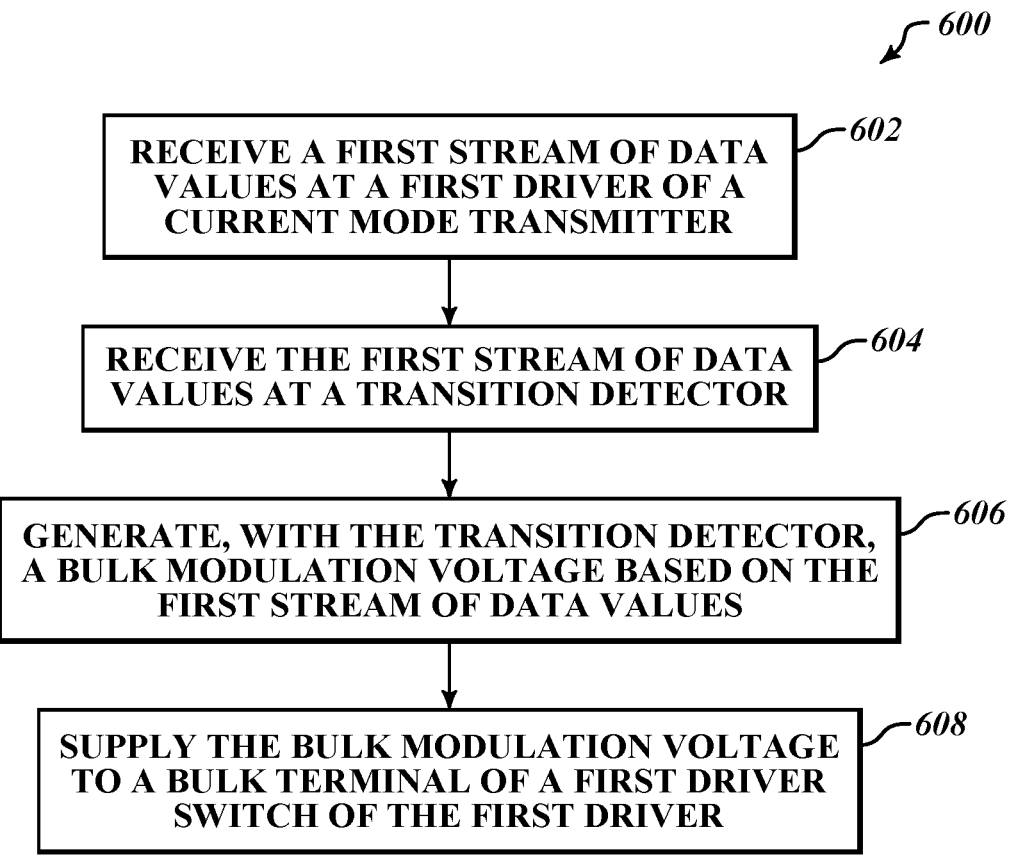
FIG. 6 is a flow diagram of a method for operating a current mode transmitter, according to one embodiment.

FIG. 6 is a flow diagram of a method 600, according to one embodiment. The method 600 can utilize systems, components, and processes described in relation to FIGS. 1A-5. At 602, the method 600 includes receiving a first stream of data values at a first driver of a current mode transmitter. At 604, the method 600 includes receiving the first stream of data values at a transition detector. At 606, the method 600 includes generating, with the transition detector, a bulk modulation voltage based on the first stream of data values. At 608, the method 600 includes supplying the bulk modulation voltage to a bulk terminal of a first driver switch of the first driver.

Figure 7:
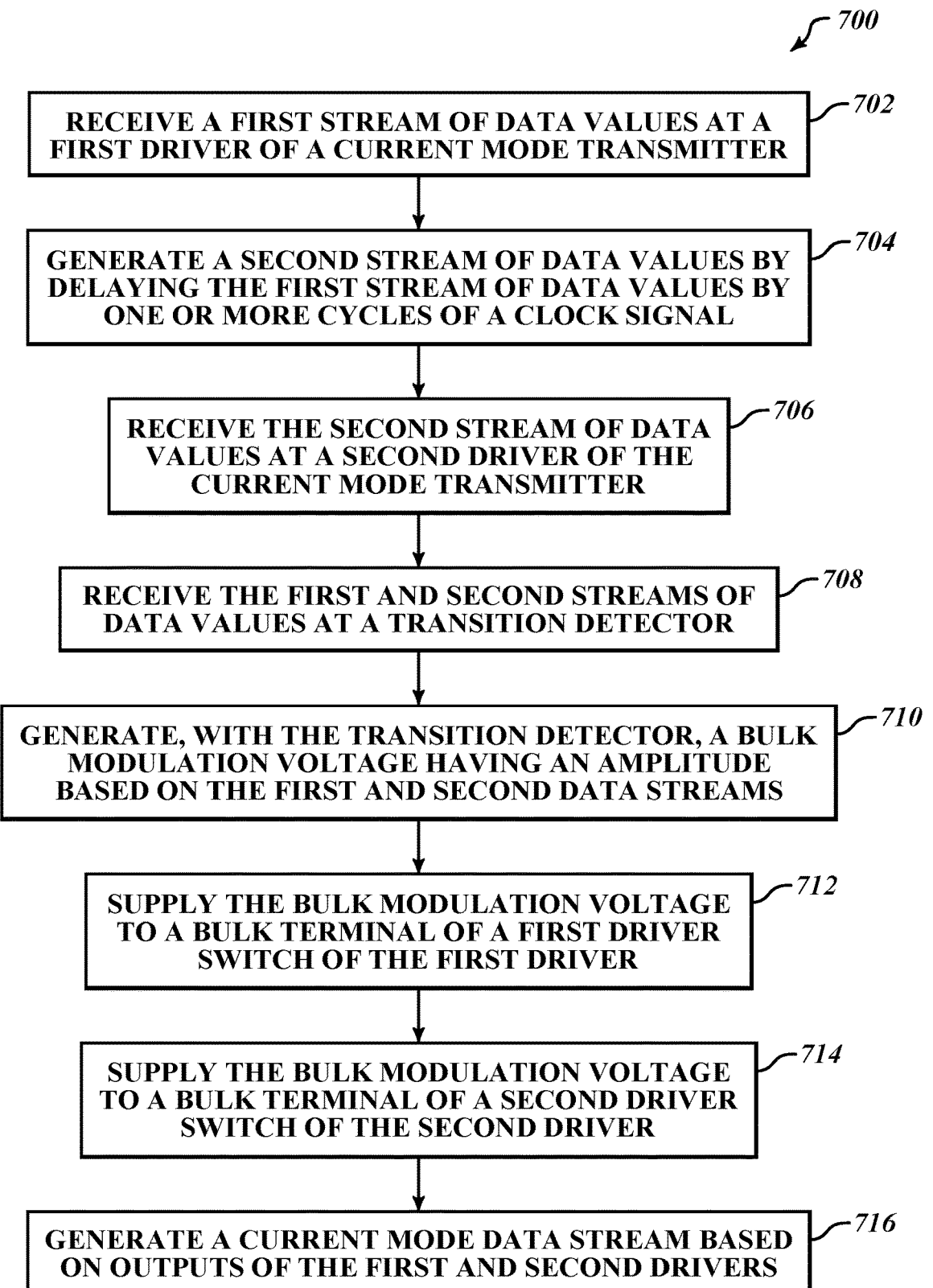
FIG. 7 is a flow diagram of a method for operating a current mode transmitter, according to one embodiment.

FIG. 7 is a flow diagram of a method 700, according to one embodiment. The method 700 can utilize systems, components, and processes described in relation to FIGS. 1A-6. At 702, the method 700 includes receiving a first stream of data values at a first driver of a current mode transmitter. At 704, the method 700 includes generating a second stream of data values by delaying the first stream of data values by one or more cycles of a clock signal. At 706, the method 700 includes receiving the second stream of data values at a second driver of the current mode transmitter. At 708, the method 700 includes receiving the first and second streams of data values at a transition detector. At 710, the method 700 includes generating, with the transition detector, a bulk modulation voltage having an amplitude based on the first and second data streams. At 712, the method 700 includes supplying the bulk modulation voltage to a bulk terminal of a first driver switch of the first driver. At 714, the method 700 includes supplying the bulk modulation voltage to a bulk terminal of a second driver switch of the second driver. At 716, the method 700 includes generating a current mode data stream based on outputs of the first and second drivers.

In one embodiment, an integrated circuit includes an input data source and a current mode transmitter coupled to the input data source. The current mode transmitter includes a primary driver including a first driver switch, a secondary driver including a second driver switch, a delay circuit coupled between the input data source and the secondary driver, and a transition detector. The transition detector includes a first input coupled to the input of the primary driver and the secondary driver, a second input coupled to the input of the secondary driver, and an output coupled to a bulk terminal of the first driver switch and to a bulk terminal of the second driver switch.

In one embodiment, an integrated circuit includes a first driver of a current mode transmitter. The first driver includes an input and a first driver switch having a bulk terminal. The integrated circuit includes a transition detector having an input coupled to an input of the first driver circuit and an output coupled to the bulk terminal of the first driver switch.

In one embodiment, a method includes receiving a first stream of data values at a first driver of a current mode transmitter and receiving the first stream of data values at a transition detector. The method includes generating, with the transition detector, a bulk modulation voltage based on the first stream of data values and supplying the bulk modulation voltage to a bulk terminal of a first driver switch of the first driver.

In one embodiment, a method includes receiving a first stream of data values at a first driver of a current mode transmitter, generating a second stream of data values by delaying the first stream of data values by one or more cycles of a clock signal, receiving the second stream of data values at a second driver of the current mode transmitter, and receiving the first and second streams of data values at a transition detector. The method includes generating, with the transition detector, a bulk modulation voltage having an amplitude based on the first and second data streams, supplying the bulk modulation voltage to a bulk terminal of a first driver switch of the first driver, supplying the bulk modulation voltage to a bulk terminal of a second driver switch of the second driver, and generating a current mode data stream based on outputs of the first and second drivers.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
an input data source;
a current mode transmitter coupled to the input data source and including:
a primary driver including a first driver switch;
a secondary driver including a second driver switch;

a delay circuit coupled between the input data source and the secondary driver;

a transition detector having:

a first input coupled to an input of the primary driver;

a second input coupled to an input of the secondary driver;

an output coupled to a bulk terminal of the first driver switch and to a bulk terminal of the second driver switch;

a first predriver circuit coupled between the input data source and the primary driver; and a second predriver circuit coupled between the delay circuit and secondary driver, wherein the input data source provides a data stream to the input of the primary driver and to an input of the delay circuit, wherein the delay circuit provides, to the input of the secondary driver, a delayed data stream delayed relative to the data stream.

2. The integrated circuit of claim 1, wherein the transition detector includes a logic gate.

3. The integrated circuit of claim 2, wherein the logic gate is an XOR gate.

4. The integrated circuit of claim 1, wherein the transition detector outputs a high supply voltage to the bulk terminals of the first and second driver switches when a value of the data stream changes.

5. The integrated circuit of claim 4, wherein the transition detector outputs a low supply voltage to the bulk terminals of the first and second driver switches when the value of the data stream does not change.

6. The integrated circuit of claim 1, wherein the data input source outputs the data stream in accordance with a clock signal.

7. The integrated circuit of claim 6, wherein the delayed data stream is delayed relative to the data stream by a single cycle of the clock signal.

8. The integrated circuit of claim 1, wherein the primary driver and the secondary driver collectively provide output data.

9. An integrated circuit, comprising:

an input data source;

a current mode transmitter including:

a primary driver of a current mode transmitter, the primary driver including an input and a first driver switch having a bulk terminal;

a secondary driver of the current mode transmitter, the secondary driver including an input and a second driver switch having a bulk terminal;

a delay circuit coupled between the input data source and the secondary driver;

a transition detector having:

a first input coupled to an input of the primary driver;

a second input coupled to an input of the secondary driver; and an output coupled to the bulk terminal of the first driver switch and to the bulk terminal of the second driver switch;

a first predriver circuit coupled between the input data source and the primary driver; and a second predriver circuit coupled between the delay circuit and secondary driver, wherein the input data source provides a data stream to the input of the primary driver and to an input of the delay circuit, wherein the delay circuit provides, to the input of the secondary driver, a delayed data stream delayed relative to the data stream.

10. The integrated circuit of claim 9, comprising a transmission line coupled to an output of the primary driver and the secondary driver.

11. The integrated circuit of claim 10, wherein the primary driver and the secondary driver are configured to output a data stream onto the transmission line in a current mode scheme.

12. The integrated circuit of claim 9, wherein the first driver switch includes a plurality of transistors coupled together in parallel.

13. A method, comprising:

receiving, from an input data source, a stream of data values at a primary driver of a current mode transmitter;

receiving, with a delay circuit of the current mode transmitter, the stream of data values from the input data source;

providing, to a secondary driver of the current mode transmitter from the delay circuit, a delayed data stream delayed relative to the data stream, the delay circuit being coupled between the input data source and the secondary driver;

receiving the stream of data values at a first input of a transition detector and the delayed stream of data values at a second input of the transition detector;

generating, with the transition detector, a bulk modulation voltage based on the stream of data values; and supplying the bulk modulation voltage to a bulk terminal of a first driver switch of the primary driver and to a bulk terminal of a second driver switch of the secondary driver, wherein the current mode transmitter includes a first predriver circuit coupled between the input data source and the primary driver and a second predriver circuit coupled between the delay circuit and secondary driver.

14. The method of claim 13, wherein the bulk modulation voltage goes high when the stream of data values transitions from high to low or from low to high.

15. The method of claim 13, wherein the bulk modulation voltage goes low when the stream of data values does not change for two or more consecutive clock cycles.

16. The method of claim 13, comprising driving, with the primary driver, a current having a first value when the bulk modulation signal is low and a second value different than the first value when the bulk modulation signal is high.

17. The method of claim 16, wherein the second value is higher than the first value.

* * * * *